United States Patent [19]
Miki et al.

[11] Patent Number: 6,021,068
[45] Date of Patent: Feb. 1, 2000

[54] NONVOLATILE SEMICONDUCTOR MEMORY WITH READ CIRCUIT USING FLIP-FLOP TYPE SENSE AMPLIFIER

[75] Inventors: Kazuhiko Miki; Hideo Sakai, both of Yokohama, Japan

[73] Assignee: Kabushiki Kaisha Toshiba, Kawasaki, Japan

[21] Appl. No.: 09/238,638

[22] Filed: Jan. 28, 1999

[30] Foreign Application Priority Data

Jan. 28, 1998 [JP] Japan .................................. 10-015783

[51] Int. Cl.$^7$ ...................................................... C11C 11/34
[52] U.S. Cl. ................................ 365/185.21; 365/185.2; 365/185.25; 365/203
[58] Field of Search ........................... 365/185.21, 185.2, 365/185.25, 205, 203

[56] References Cited

U.S. PATENT DOCUMENTS 5,270,978 12/1993 Matsumoto et al. .
5,473,570 12/1995 Sato et al. ...................... 365/185.21 X
5,757,697 5/1998 Briner .............................. 365/185.25 X
5,936,888 8/1999 Sugawara .............................. 365/185.2

FOREIGN PATENT DOCUMENTS 9-219095 8/1997 Japan .

*Primary Examiner*—Huan Hoang
*Attorney, Agent, or Firm*—Oblon, Spivak, McClelland, Maier & Neustadt, P.C.

[57] ABSTRACT

A nonvolatile semiconductor memory of this invention includes a data storage read cell in which the threshold is set to turn on/off the read cell in accordance with storage data upon selection, a reference cell in which the threshold is set to turn on the reference cell upon selection, and a flip-flop type amplifier for reading out whether the read cell is an ON or OFF cell. In this nonvolatile semiconductor memory, whether the read cell is an ON or OFF cell is read out by comparing changes in bit line voltages of the read and reference cells using the flip-flop type sense amplifier by a method of performing precharge and then discharge. At this time, a word line connected to the read cell is set to a selected state in synchronism with the start of precharge, and a word line connected to the reference cell is set to a selected state in synchronism with the end of precharge.

8 Claims, 5 Drawing Sheets

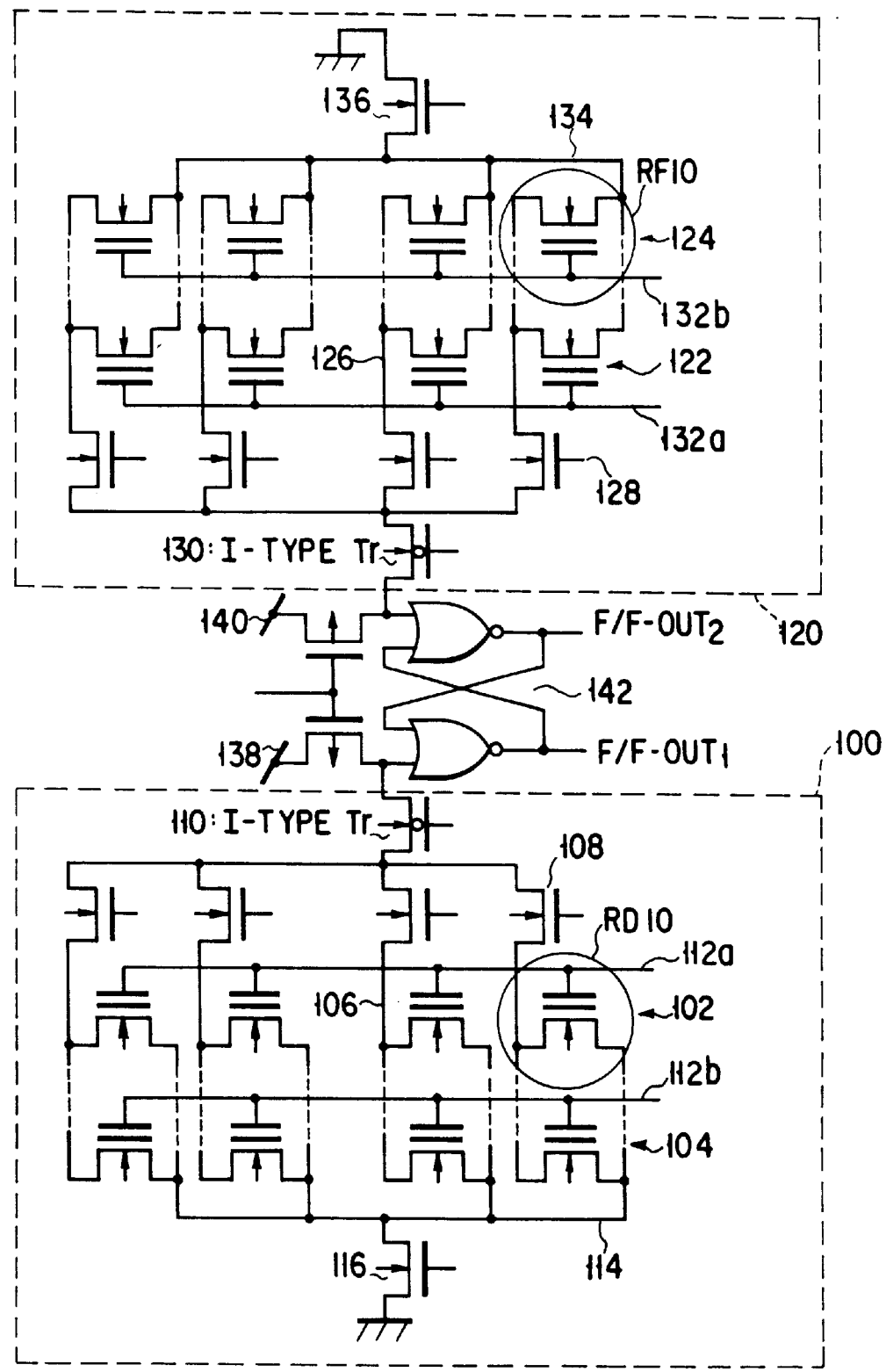
F I G. 1

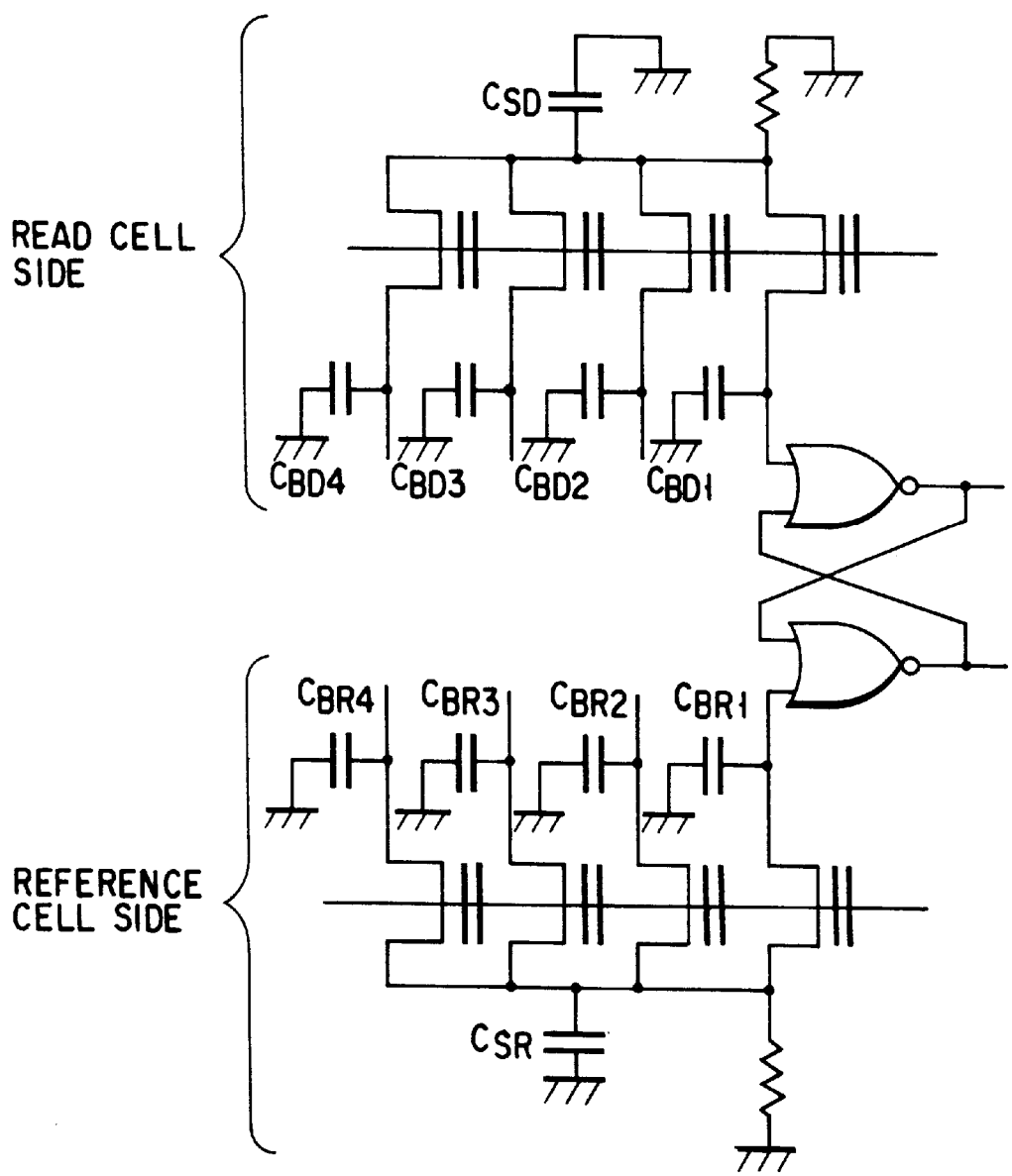
F I G. 2

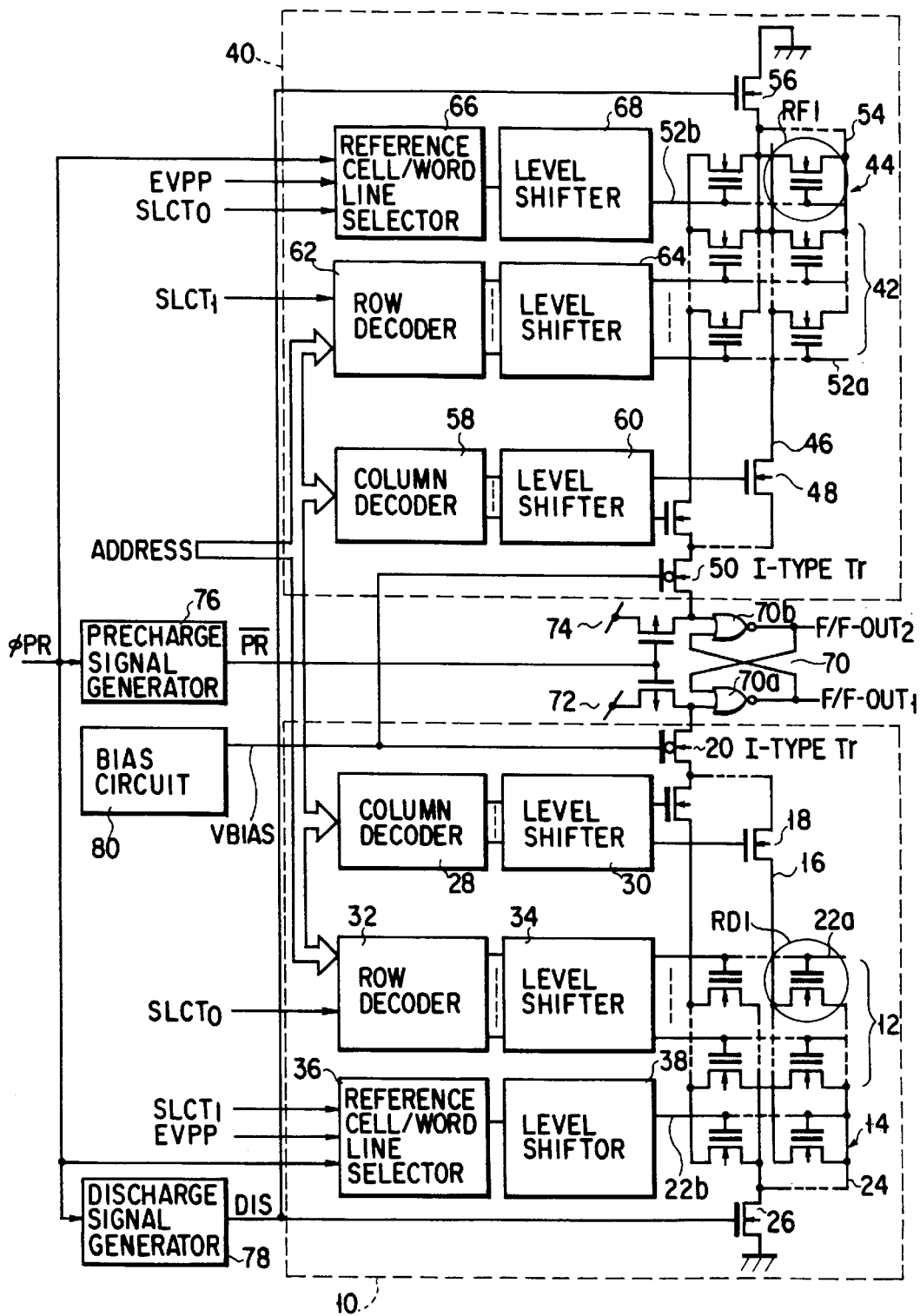
F I G. 5

NONVOLATILE SEMICONDUCTOR MEMORY WITH READ CIRCUIT USING FLIP-FLOP TYPE SENSE AMPLIFIER

BACKGROUND OF THE INVENTION

The present invention relates to a nonvolatile semiconductor memory for reading out data by a read circuit using a flip-flop type sense amplifier and, more particularly, to a nonvolatile semiconductor memory demanded for a high-speed or low-voltage read or requiring address switching during precharge due to system limitations.

A conventional nonvolatile semiconductor memory such as an EPROM for reading out data by comparing changes in drain voltages (bit line voltages) of read (target) and reference cells by a precharge/discharge method using a flip-flop type sense amplifier will be described. This conventional nonvolatile semiconductor memory is disclosed in detail in Jpn. Pat. Appln. KOKOKU Publication No. 7-70235.

FIG. 1 is a circuit diagram showing a memory cell array in the conventional nonvolatile semiconductor memory.

In FIG. 1, data storage read cells are laid out in an array to form a read cell group 102 on a memory surface 100 of the nonvolatile semiconductor memory. In this read cell, the threshold voltage is set to turn on/off the cell in accordance with storage data upon selection. Reference cells are laid out in an array to form a reference cell group 104 on the memory surface 100. In this reference cell, the threshold voltage is set to turn on the cell upon selection. The read and reference cell groups 102 and 104 form a memory cell array.

In this memory cell array, a bit line 106 commonly connected to the drains of read and reference cells on the same column is connected to an I (Intrinsic) type transistor (to be referred to as an I-type Tr) 110 via a column select transistor (to be referred to as a column select Tr) 108. The I-type Tr has an intrinsic semiconductor in an active region.

In the memory cell array, the control gates of read cells on the same row are connected to a common word line 112a, whereas the control gates of reference cells are connected to a common word line 112b. In the memory cell array, a common source line 114 connected to the sources of the read and reference cells is connected to a reference potential (GND) via a discharge transistor (to be referred to as a discharge Tr) 116.

Similarly, data storage read cells are laid out in an array to form a read cell group 122 on a memory surface 120 of the nonvolatile semiconductor memory. In this read cell, the threshold voltage is set to turn on/off the cell in accordance with storage data upon selection. Reference cells are laid out in an array to form a reference cell group 124 on the memory surface 120. In this reference cell, the threshold voltage is set to turn on the cell upon selection. The read and reference cell groups 122 and 124 form a memory cell array.

In this memory cell array, a bit line 126 commonly connected to the drains of read and reference cells on the same column is connected to an I-type Tr 130 via a column select Tr 128. In the memory cell array, the control gates of read cells on the same row are connected to a common word line 132a, while the control gates of reference cells are connected to a common word line 132b. In the memory cell array, a common source line 134 connected to the sources of the read and reference cells is connected to the reference potential (GND) via a discharge Tr 136.

In the nonvolatile semiconductor memory shown in FIG. 1, in a read from, e.g., a read cell RD10 of the memory surface 100, a reference cell RF10 of the memory surface 120 is selected and used. The difference between the read and reference cells RD10 and RF10 is that the read cell RD10 is designed with a larger transconductance Gm.

When the read cell RD10 is an ON cell (in which no data is written), the memory surface 100 and memory surface 120 are set to completely the same precharge state (potentials of all the portions are equal) via precharge transistors (to be referred to as precharge Trs) 138 and 140. Upon discharge, the bit line potential (input potential to a flip-flop 142) on the read cell side (memory surface 10 side) first exceeds the circuit threshold of the flip-flop 142 owing to the difference in transconductance Gm to invert an output F/F-OUT1 of the flip flop 142 from "0" to "1".

When the read cell RD10 is an OFF cell (in which data is written), the bit line potential on the reference cell side (memory surface 40 side) which is always ON first exceeds the circuit threshold of the flip-flop 142 to invert an output F/F-OUT2 of the flip flop 142 from "0" to "1". Even if the bit line potential on the read cell side then exceeds the circuit threshold of the flip-flop 142 due to OFF leakage or the like, the output F/F-OUT1 is held at "0". In this way, in the conventional nonvolatile semiconductor memory, whether the read cell RD10 is an ON or OFF cell is read out depending on "1" or "0" of the output F/F-OUT1.

The conventional nonvolatile semiconductor memory operates normally as far as the read cell side surface and reference cell side surface are equal in precharge state as much as possible in a read from an ON cell. To operate the memory within the limitation, the read and reference cell sides have the same memory cell array arrangement, and the parasitic resistances and parasitic capacitances belonging to the read and reference cells RD10 and RF10 are made equal.

Considering entrance of charges to an adjacent cell commonly connected to the source line, a capacitance to be precharged changes depending on whether data is written in the adjacent cell.

FIG. 2 is an equivalent circuit diagram showing the parasitic capacitances of the bit and source lines of the memory cell array in the conventional nonvolatile semiconductor memory. Of memory cells commonly connected to the source line, only a memory cell connected to selected bit and word lines is an ON cell, and remaining memory cells are OFF cells. Since only the read cell RD10 is an ON cell on the read cell side, a parasitic capacitance Cread on the read cell side is given as follows. Since all the reference cells RF10 are ON cells on the reference cell side, a parasitic capacitance Cref on the reference cell side is given as follows.

$Cread = C_{BD1} + C_{SD}$ $Cref = C_{BR1} + C_{SR} + C_{BR2} + C_{BR3} + C_{BR4}$ where Cread<Cref for $C_{BD1}=C_{BR1}$ and $C_{SD}=C_{SR}$; and $C_{BD1}$, $C_{BD2}$, $C_{BD3}$, and $C_{BD4}$ are parasitic capacitances by a read cell side bit line, $C_{SD}$ is a parasitic capacitance by a read cell side source line, $C_{BR1}$, $C_{BR2}$, $C_{BR3}$, and $C_{BR4}$ are parasitic capacitances by a reference cell side bit line, and $C_{SR}$ is a parasitic capacitance by a reference cell side source line.

If the precharge period is short in this state, charge share occurs. If charge share or the like makes the precharge states of the read and reference cell sides different from each other, the discharge speed is influenced by another factor except for the aforementioned transconductances Gm of the read and reference cells RD10 and RF10. In the worst case, as shown in FIG. 3, charge share causes a reverse phenomenon that the reference cell side is discharged prior to the read cell side, thus reading out data from an ON cell as an OFF cell.

To avoid this problem, the nonvolatile semiconductor memory adopts a read method of turning on the discharge transistor slightly before the completion of precharge and removing charges entering from the source line, or a method of keeping the discharge transistor on even during the precharge period to prevent entrance of charges to an adjacent cell. The latter method is employed when the priority is given to the speed rather than the current consumption.

In either method, however, charges may be unbalanced to cause malfunction if the bit line of the memory cell is not satisfactorily precharged. A sufficiently long precharge period must therefore be ensured.

For this reason, in the conventional nonvolatile semiconductor memory, an address setup period is set not to switch the address during the precharge period. FIG. 4 is a timing chart showing a read from an ON cell in the conventional nonvolatile semiconductor memory. As shown in FIG. 4, precharge starts after a predetermined address setup period upon reception of an address signal. This is because if the address is switched during the precharge period, an actual period for precharging a target bit line is shortened.

The length of the address setup period is determined by a delay time before an input address signal is decoded to select bit and word lines, and is substantially determined by the number of logic stages of a decoding circuit and the power supply voltage. In the nonvolatile semiconductor memory for a synchronous read, although the precharge period and the sense period by the flip-flop can be shortened, the total access time in a read cannot be shortened unless the address setup period is shortened or eliminated.

Recent nonvolatile semiconductor memories adopt interleaving or the like as a high-speed read method. In such a read, the system may not set any address setup period. In this case, the conventional read method described above cannot be used.

BRIEF SUMMARY OF THE INVENTION

The present invention has been made to solve the above problems, and has as its object to provide a nonvolatile semiconductor memory capable of preventing a read error when no address setup period is set, and realizing a higher-speed read or lower-voltage operation.

To achieve the above object, according to the present invention, there is provided a nonvolatile semiconductor memory comprising a data storage read cell in which a threshold is set to turn on/off the read cell in accordance with storage data upon selection, a reference cell in which a threshold is set to turn on the reference cell upon selection, a flip-flop type sense amplifier for comparing changes in bit line voltages of the read and reference cells and reading out whether the read cell is an ON or OFF cell by a method of performing precharge and then discharge, a circuit for setting a word line connected to the read cell to a selected state in synchronism with a start of precharge, and a circuit for setting a word line connected to the reference cell to a selected state in synchronism with an end of precharge.

In the nonvolatile semiconductor memory having this arrangement, the address setup period set in the conventional nonvolatile semiconductor memory is eliminated to perform the input of an address and the start of precharge at the same timing. In addition, a word line connected to the reference cell is selected upon the end of precharge. This reduces the parasitic capacitance on the reference cell side to be equal to the parasitic capacitance on the read cell side, or the parasitic capacitance on the read cell side is set larger than the parasitic capacitance on the reference cell side. Even if precharge is short, charge share hardly occurs.

According to the present invention, there is provided a nonvolatile semiconductor memory comprising a first memory cell array constituted by laying out in an array data storage read cells in each of which a threshold is set to turn on/off the read cell in accordance with storage data upon selection, and reference cells in each of which a threshold is set to turn on the reference cell upon selection, a second memory cell array constituted by laying out in an array data storage read cells in each of which a threshold is set to turn on/off the read cell in accordance with storage data upon selection, and reference cells in each of which a threshold is set to turn on the reference cell upon selection, word lines each commonly connected to control gates of read cells on the same row in each of the first and second memory cell arrays, word lines each commonly connected to control gates of reference cells on the same row in each of the first and second memory cell arrays, a flip-flop type sense amplifier for comparing changes in bit line voltages of the read and reference cells and reading out whether the read cell is an ON or OFF cell by a method of precharging and then discharging the first and second memory cell arrays, a circuit for setting a word line connected to the read cell to a selected state in synchronism with a start of precharge, and a circuit for setting a word line connected to the reference cell to a selected state in synchronism with an end of precharge.

In the nonvolatile semiconductor memory having this arrangement, the address setup period set in the conventional nonvolatile semiconductor memory is eliminated to perform the input of an address and the start of precharge at the same timing. Further, a word line connected to the reference cell is selected upon the end of precharge. This reduces the parasitic capacitance on the reference cell side to be equal to the parasitic capacitance on the read cell side, or the parasitic capacitance on the read cell side is set larger than the parasitic capacitance on the reference cell side. Even if precharge is short, charge share hardly occurs.

According to the present invention, there is provided a nonvolatile semiconductor memory comprising a first memory cell array constituted by laying out in an array data storage read cells in each of which a threshold is set to turn on/off the read cell in accordance with storage data upon selection, and reference cells in each of which a threshold is set to turn on the reference cell upon selection, a second memory cell array constituted by laying out in an array data storage read cells in each of which a threshold is set to turn on/off the read cell in accordance with storage data upon selection, and reference cells in each of which a threshold is set to turn on the reference cell upon selection, word lines each commonly connected to control gates of read cells on the same row in each of the first and second memory cell arrays, word lines each commonly connected to control gates of reference cells on the same row in each of the first and second memory cell arrays, a flip-flop type sense amplifier for comparing changes in bit line voltages of the read and reference cells and reading out whether the read cell is an ON or OFF cell by a method of precharging and then discharging the first and second memory cell arrays, a circuit for starting precharge in synchronism with input of an address signal for designating which of the word lines connected to the read cells is set to a selected state, and means for setting a word line connected to the reference cell to a selected state in synchronism with an end of precharge.

In the nonvolatile semiconductor memory having this arrangement, the address setup period set in the conventional nonvolatile semiconductor memory is eliminated to perform the input of an address and the start of precharge at the same timing. Moreover, a word line connected to the upon the end o is selected upon the end of precharge. This reduces the parasitic capacitance on the reference cell side to be equal to the parasitic capacitance on the read cell side, or the parasitic capacitance on the read cell side is set larger than the parasitic capacitance on the reference cell side. Even if precharge is short, charge share hardly occurs.

According to the present invention, there is provided a nonvolatile semiconductor memory comprising a first memory cell array constituted by laying out in an array data storage read cells in each of which a threshold is set to turn on/off the read cell in accordance with storage data upon selection, and reference cells in each of which a threshold is set to turn on the reference cell upon selection, a second memory cell array constituted by laying out in an array data storage read cells in each of which a threshold is set to turn on/off the read cell in accordance with storage data upon selection, and reference cells in each of which a threshold is set to turn on the reference cell upon selection, word lines each commonly connected to control gates of read cells on the same row in each of the first and second memory cell arrays, word lines each commonly connected to control gates of reference cells on the same row in each of the first and second memory cell arrays, a flip-flop type sense amplifier for comparing changes in bit line voltages of the read and reference cells and reading out whether the read cell is an ON or OFF cell by a method of precharging and then discharging the first and second memory cell arrays, and a setting circuit for setting a word line connected to the reference cell to either of selected and unselected states in synchronism with a precharge signal for forming a precharge/discharge timing.

In the nonvolatile semiconductor memory having this arrangement, the address setup period set in the conventional nonvolatile semiconductor memory is eliminated. A word line connected to the reference cell is set to an unselected state at the start of precharge and to a selected state at the end of precharge (start of discharge) in accordance with a precharge signal for forming a precharge or discharge timing. This reduces the parasitic capacitance on the reference cell side to be equal to the parasitic capacitance on the read cell side, or the parasitic capacitance on the read cell side is set larger than the parasitic capacitance on the reference cell side. Even if precharge is short, charge share hardly occurs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a memory cell array in a conventional nonvolatile semiconductor memory;

FIG. 2 is an equivalent circuit diagram showing the parasitic capacitances of bit and source lines of the memory cell array in the conventional nonvolatile semiconductor memory;

FIG. 5 is a circuit diagram showing a nonvolatile semiconductor memory according to an embodiment of the present invention;

DETAILED DESCRIPTION OF THE INVENTION

Figure 3:
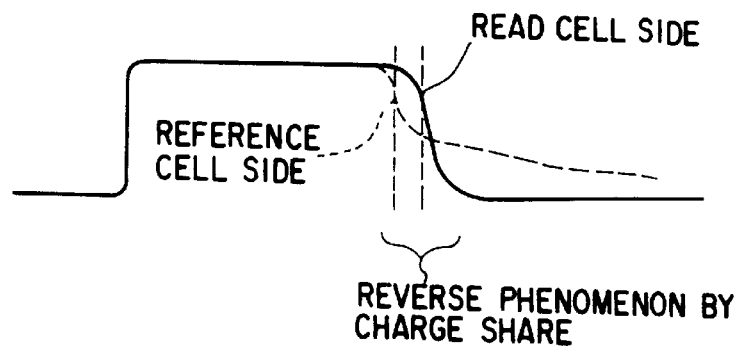
FIG. 3 is a waveform chart showing a reverse phenomenon caused by charge share that the reference cell side is discharged prior to the read cell side.
Figure 4:
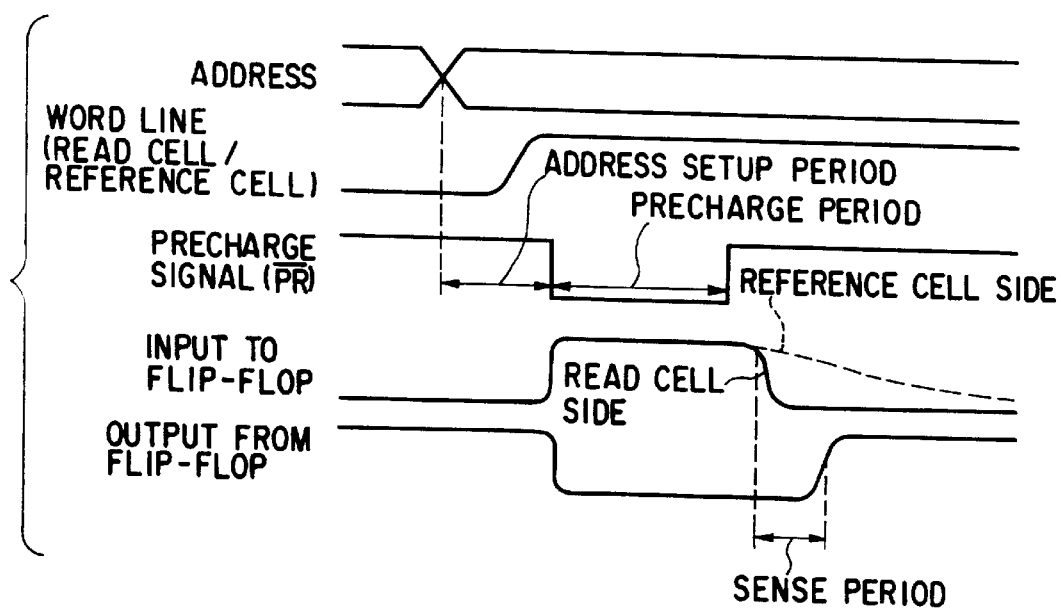
FIG. 4 is a timing chart showing a read from an ON cell in the conventional nonvolatile semiconductor memory.

A nonvolatile semiconductor memory according to an embodiment of the present invention will be described with reference to the several views of the accompanying drawing.

FIG. 5 is a circuit diagram showing a nonvolatile semiconductor memory according to the embodiment of the present invention.

In this nonvolatile semiconductor memory, data is read out by comparing changes in drain voltages (bit line voltages) of read (target) and reference cells by a precharge/discharge method using a flip-flop type sense amplifier.

As shown in FIG. 5, data storage read cells RD1 are laid out in an array to form a read cell group 12 on a memory surface 10 of the nonvolatile semiconductor memory. In this read cell RD1, the threshold voltage is set to turn on/off the cell in accordance with storage data upon selection. Reference cells are laid out in an array to form a reference cell group 14 on the memory surface 10. In this reference cell, the threshold voltage is set to turn on the cell upon selection. The read and reference cell groups 12 and 14 form a memory cell array.

In this memory cell array, a bit line 16 commonly connected to the drains of read and reference cells on the same column is connected to an I (Intrinsic) type transistor (to be referred to as an I-type Tr) 20 via a column select transistor (to be referred to as a column select Tr) 18. The control gates of read cells on the same row are connected to a common word line 22a, whereas the control gates of reference cells are connected to a common word line 22b. A common source line 24 connected to the sources of the read and reference cells is connected to a reference potential (GND) via a discharge transistor (to be referred to as a discharge Tr) 26.

A column decoder 28 for selecting the bit line 16 in accordance with an input address signal is connected to the gate of the column select Tr 18 via a level shifter 30. A row decoder 32 for selecting the word line 22a in accordance with the address signal is connected to the word line 22a via a level shifter 34. A reference cell/word line selector 36 for selecting the word line 22b of the reference cell is connected to the word line 22b via a level shifter 38.

Similarly, data storage read cells are laid out in an array to form a read cell group 42 on a memory surface 40 of the nonvolatile semiconductor memory. In this read cell, the threshold voltage is set to turn on/off the cell in accordance with storage data upon selection. Reference cells RF1 are laid out in an array to form a reference cell group 44. In this reference cell RF1, the threshold voltage is set to turn on the cell upon selection. The read and reference cell groups 42 and 44 form a memory cell array.

In this memory cell array, a bit line 46 commonly connected to the drains of read and reference cells on the same column is connected to an I-type Tr 50 via a column select Tr 48. The control gates of read cells on the same row are connected to a common word line 52a, while the control gates of reference cells are connected to a common word line 52b. A common source line 54 connected to the sources of the read and reference cells is connected to the reference potential (GND) via a discharge Tr 56.

A column decoder 58 for selecting the bit line 46 in accordance with an input address signal is connected to the gate of the column select Tr 48 via a level shifter 60. A row decoder 62 for selecting the word line 52a in accordance with the address signal is connected to the word line 52a via a level shifter 64. A reference cell/word line selector 66 for selecting the word line 52b of the reference cell is connected to the word line 52b via a level shifter 68.

A flip-flop 70 made up of NOR gate circuits 70a and 70b is connected between the I-type Tr 20 of the memory surface 10 and the I-type Tr 50 of the memory surface 40. Precharge transistors (to be referred to as precharge Trs) 72 and 74 connected to the power supply voltage are respectively connected to the inputs of the flip-flop 70.

A precharge signal (φPR) for forming a precharge/discharge timing is externally supplied. This signal φPR is input to a precharge signal generator 76, and a signal $\overline{PR}$ generated by the precharge signal generator 76 is input to the gates of the precharge Trs 72 and 74. The signal φPR is input to a discharge signal generator 78, and a signal DIS generated by the discharge signal generator 78 is input to the gates of the discharge Trs 26 and 56. The signal φPR is further input to the reference cell/word line selectors 36 and 66.

An address signal supplied externally is input to the column decoders 28 and 58 and the row decoders 32 and 62. Signals SLCT0 and SLCT1 for controlling whether either the memory surface 10 or memory surface 40 is defined as a read cell side are externally supplied. The signal SLCT0 is input to the row decoder 32 and reference cell/word line selector 66, while the signal SLCT1 is input to the reference cell/word line selector 36 and row decoder 62.

A signal EVPP for forcibly setting the word lines 22b and 52b of the reference cells to an unselected state in a write is externally supplied. This signal EVPP is input to the reference cell/word line selectors 36 and 66. A bias circuit 80 outputs a signal VBIAS for biasing the bit lines 16 and 46, and the signal VBIAS is input to the gates of the I-type Trs 20 and 50. F/F-OUT1 is output from the output of the NOR gate circuit 70a which is connected to the I-type Tr 20 of the memory surface 10 and constitutes the flip-flop 70. F/F-OUT2 is output from the output of the NOR gate circuit 70b which is connected to the I-type Tr 50 of the memory surface 40 and constitutes the flip-flop 70.

Figure 6:
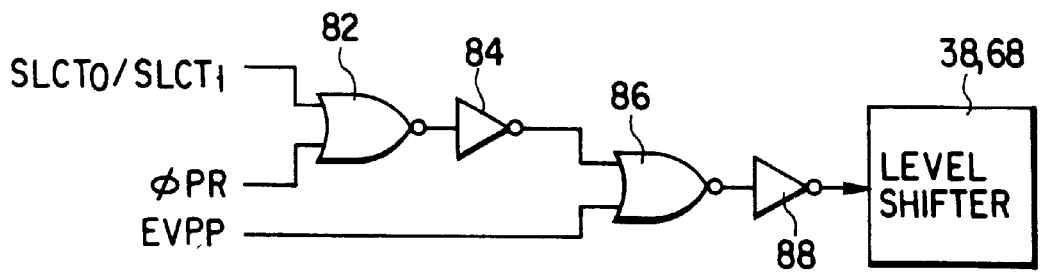
FIG. 6 is a circuit diagram showing the detailed arrangement of a reference cell/word line selector.

The detailed arrangements of the reference cell/word line selectors 36 and 66 will be explained. FIG. 6 is a circuit diagram showing the detailed arrangement of the reference cell/word line selector.

The signal SLCT0 or SLCT1 is input to the first terminal of a NOR gate circuit 82, and the signal φPR is input to the second terminal of the NOR gate circuit 82. The output of the NOR gate circuit 82 is connected to the first terminal of a NOR gate circuit 86 via an inverter 84, and the signal EVPP is input to the second terminal of the NOR gate circuit 86. The output of the NOR gate circuit 86 is connected to the level shifter 38 or 68 via an inverter 88, thereby constituting the reference cell/word line selector 36 or 66.

Operation of the nonvolatile semiconductor memory according to the embodiment will be described.

Figure 7:
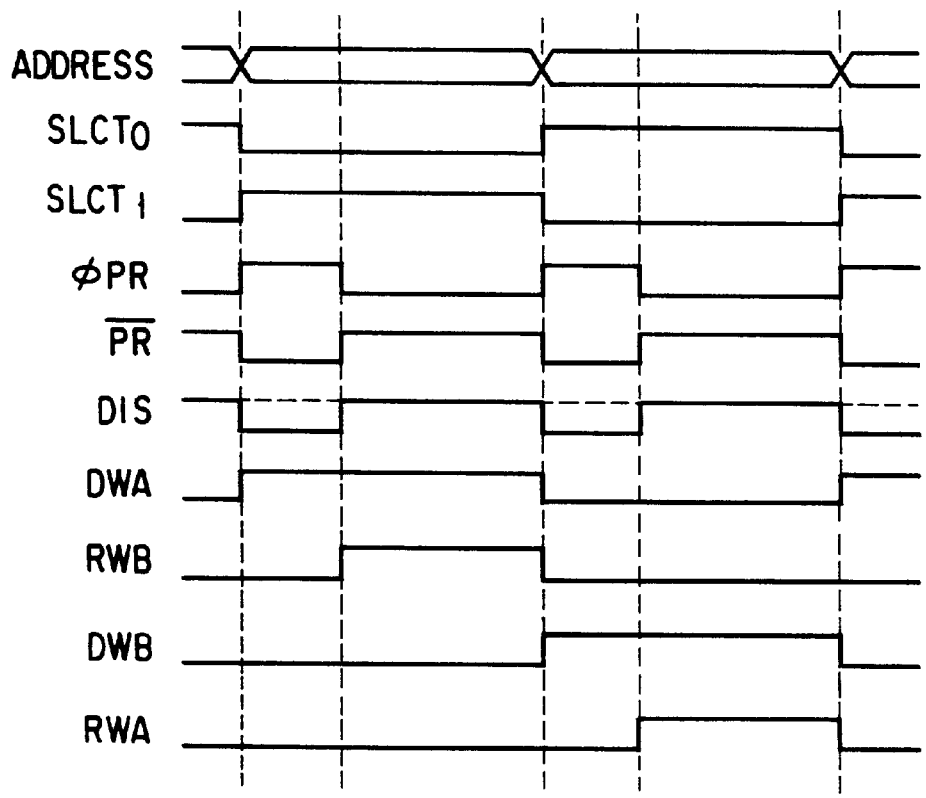
FIG. 7 is a timing chart showing a read in the nonvolatile semiconductor memory according to the embodiment of the present invention.

FIG. 7 is a timing chart showing a read in the nonvolatile semiconductor memory according to the embodiment of the present invention.

Operation in a read from, e.g., the read cell RD1 of the memory surface 10 in the nonvolatile semiconductor memory shown in FIG. 5 will be explained. The general description of the operation is as follows. In a read from the read cell RD1 of the memory surface 10, the reference cell RF1 of the memory surface 40 is selected and used. The difference between the read and reference cells RD1 and RF1 is that the read cell RD1 is designed with a larger transconductance Gm.

When the read cell RD1 is an ON cell (in which no data is written), the memory surface 10 (read cell side) having the read cell RD1, and the memory surface 40 (reference cell side) having the reference cell RF1 are set to completely the same precharge state (potentials of all the portions are equal) via the precharge Trs 72 and 74. Upon discharge, the bit line potential (input potential to the flip-flop) on the read cell side first exceeds the circuit threshold of the flip-flop 70 owing to the difference in transconductance Gm to invert the output F/F-OUT1 from "0" to "1".

When the read cell RD1 is an OFF cell (in which data is written), the bit line potential on the reference cell side which is always ON first exceeds the circuit threshold of the flip-flop 70 to invert the output F/F-OUT2 from "0" to "1". Even if the bit line potential on the read cell side then exceeds the circuit threshold of the flip-flop 70 due to OFF leakage or the like, the output F/F-OUT1 is held at "0". In the nonvolatile semiconductor memory shown in FIG. 5, whether the read cell RD1 is an ON or OFF cell is read out depending on "1" or "0" of the output F/F-OUT1.

Operation in a read from the read cell RD1 will be described in detail.

An address signal (ADDRESS) like the one shown in FIG. 7 is input to the row decoders 32 and 62 and the column decoders 28 and 58. This address signal designates the position of a read cell RD1 subjected to a read. The row decoder 32 selects a word line 22a, and the column decoder 28 selects a bit line 16.

Simultaneously when the address signal is input, the trailing edge of a signal SLCT0 like the one shown in FIG. 7 from "1" to "0" is input to the row decoder 32. The signal SLCT0 is inverted by the level shifter 34 to a signal DWA like the one shown in FIG. 7 from "0" to "1", and the signal DWA is output to the word line 22a of the read cell RD1.

In addition, simultaneously when the address signal is input, a signal φPR like the one shown in FIG. 7 for forming a precharge/discharge timing is input to the precharge signal generator 76, discharge signal generator 78, and reference cell/word line selectors 36 and 66.

The precharge signal generator 76 generates a signal $\overline{PR}$ like the one shown in FIG. 7 from the input signal φPR. The signal $\overline{PR}$ is output to the gates of the precharge Trs 72 and 74. Accordingly, simultaneously when the address signal is input, i.e., the signal $\overline{PR}$ falls from "1" to "0", precharge starts. After precharge is performed for a predetermined period, the signal $\overline{PR}$ rises from "0" to "1" to stop precharge.

The discharge signal generator 78 generates a signal DIS like the one shown in FIG. 7 from the input signal φPR. The signal DIS is output to the gates of the discharge Trs 26 and 56. When the signal DIS falls from "1" to "0" in synchronism with the start of precharge, the discharge Trs 26 and 56 are turned off to stop discharge. Discharge is kept off while precharge is performed. The signal DIS rises from "0" to "1" in synchronism with the end of precharge to start discharge. In other words, after discharge is kept off by the same predetermined period as the precharge period, discharge starts in synchronism with the end of precharge.

As described above, the reference cell/word line selector 66 receives the signal SLCT0, the signal φPR, and the signal EVPP for forcibly setting the word line 52b of the reference cell RF1 to an unselected state in a write. The circuit as shown in FIG. 6 processes the three signals SLCT0, φPR, and EVPP, and outputs a signal RWB like the one shown in FIG. 7 to the word line 52b of the reference cell RF1 of the memory surface 40 via the level shifter 68.

Before the input of the address signal, "0" is output to the word line 52b of the reference cell RF1 to set the word line 52b to an unselected state. Even after the start of precharge at the same time as the input of the address signal, "0" is output to the word line 52b of the reference cell RF1 to keep the word line 52b in an unselected state. After precharge, "1" is output to the word line 52b in synchronism with the end of precharge to select the word line 52b.

According to this embodiment, simultaneously when the address signal is input, precharge starts, and the word line of the read cell is selected. At this time, the word line on the read cell side is selected during the precharge period, whereas the word line on the reference cell side is selected after the precharge period. On the reference cell side, only a bit line connected to the reference cell RF1 is precharged. On the reference cell side, therefore, charges do not enter bit lines other than the bit line of the reference cell RF1.

During precharge at timings shown in FIG. 7, since only the read cell becomes an ON cell on the read cell side, the parasitic capacitance Cread on the read cell side is given as follows, compared to the equivalent circuit showing the parasitic capacitances of the bit and source lines in the conventional memory cell array in FIG. 2. Since the reference cell becomes an ON cell on the reference cell side after the precharge period, the parasitic capacitance Cref on the reference cell side is given as follows.

Cread=$C_{BD1}+C_{SD}$

Cref $C_{BR1}$ where Cread>Cref for $C_{BD1}=C_{BR1}$; and $C_{BD1}$ is a parasitic capacitance by a read cell side bit line, $C_{SD}$ is a parasitic capacitance by a read cell side source line, and $C_{BR1}$ is a parasitic capacitance by a reference cell side bit line.

Input of a next address signal in the timing chart of FIG. 7 shows the timings of respective signals when the read cell side is the memory surface 40, and the reference cell side is the memory surface 10. Simultaneously when this address signal is input, a signal SLCT1 like the one shown in FIG. 7 is input to the row decoder 62 and reference cell/word line selector 36. The row decoder 62 outputs a signal DWB like the one shown in FIG. 7 to the word line 52a of the read cell of the memory surface 40. The reference cell/word line selector 36 outputs a signal RWA like the one shown in FIG. 7 to the word line 22b of the reference cell of the memory surface 10.

In the above operation, discharge stops during the precharge period. However, discharge need not stop and may be always performed by always keeping the signal DIS at "1", as indicated by the broken line in FIG. 7.

In short, the address setup period which hinders a high-speed read in the conventional nonvolatile semiconductor memory shown in FIG. 1 is eliminated to attain a high-speed read, and the input of an address and the start of precharge are performed at the same timing. The actual precharge period is shortened, so that discharge, i.e., a read (sense) by the flip-flop starts from an unsatisfactory precharge state.

If data is read out at the conventional timings in an unsatisfactory precharge state, since cells on the reference cell side are always ON cells, the parasitic capacitance belonging to a target read cell becomes greatly different from the parasitic capacitance belonging to the reference cell. In this case, particularly charge share easily occurs to reverse changes in input level to the flip-flop in a sense.

For this reason, in this embodiment, the parasitic capacitance belonging to the read cell side in precharge is intentionally set larger than the parasitic capacitance belonging to the reference cell side. That is, selection of the word line of the reference cell is changed to be performed upon the completion of precharge. Only the bit line of the reference cell is precharged on the reference cell side. Thus, the nonvolatile semiconductor memory of this embodiment can operate almost free from any error.

More specifically, in this embodiment, the address setup period set in the conventional nonvolatile semiconductor memory is eliminated to perform the input of an address and the start of precharge at the same timing. Further, the word line of the reference cell is selected upon the completion of precharge. Even if precharge is short, charge share hardly occurs to prevent a read error.

As has been described above, this embodiment can realize a higher-speed read compared to the conventional memory, and a lower-voltage operation for the same frequency by reducing the parasitic capacitance on the reference cell side. The system does not require any address setup period, and a nonvolatile semiconductor memory having a high degree of system freedom can be provided.

According to the present invention, a nonvolatile semiconductor memory capable of preventing a read error when no address setup period is set, and realizing a higher-speed read or lower-voltage operation can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a data storage read cell in which a threshold is set to turn on/off said read cell in accordance with storage data upon selection;
   a reference cell in which a threshold is set to turn on said reference cell upon selection;
   a flip-flop type sense amplifier for comparing changes in bit line voltages of said read and reference cells and reading out whether said read cell is an ON or OFF cell by a method of performing precharge and then discharge;
   a circuit for setting a word line connected to said read cell to a selected state in synchronism with a start of precharge; and
   a circuit for setting a word line connected to said reference cell to a selected state in synchronism with an end of precharge.

2. A memory according to claim 1, wherein said circuit for setting a word line connected to said reference cell to a selected state sets the word line to a selected state in accordance with a signal for forming a precharge/discharge timing and a signal for setting the word line to an unselected state in a write.

3. A nonvolatile semiconductor memory comprising:
   a first memory cell array constituted by laying out in an array data storage read cells in each of which a threshold is set to turn on/off said read cell in accordance with storage data upon selection, and reference cells in each of which a threshold is set to turn on said reference cell upon selection;

a second memory cell array constituted by laying out in an array data storage read cells in each of which a threshold is set to turn on/off said read cell in accordance with storage data upon selection, and reference cells in each of which a threshold is set to turn on said reference cell upon selection;

word lines each commonly connected to control gates of read cells on the same row in each of said first and second memory cell arrays;

word lines each commonly connected to control gates of reference cells on the same row in each of said first and second memory cell arrays;

a flip-flop type sense amplifier for comparing changes in bit line voltages of said read and reference cells and reading out whether said read cell is an ON or OFF cell by a method of precharging and then discharging said first and second memory cell arrays;

a circuit for setting a word line connected to said read cell to a selected state in synchronism with a start of precharge; and a circuit for setting a word line connected to said reference cell to a selected state in synchronism with an end of precharge.

4. A memory according to claim 3, wherein said circuit for setting a word line connected to said reference cell to a selected state sets said word line to a selected state in accordance with a signal for forming a precharge/discharge timing and a signal for setting said word line to an unselected state in a write.

5. A nonvolatile semiconductor memory comprising:

a first memory cell array constituted by laying out in an array data storage read cells in each of which a threshold is set to turn on/off said read cell in accordance with storage data upon selection, and reference cells in each of which a threshold is set to turn on said reference cell upon selection;

a second memory cell array constituted by laying out in an array data storage read cells in each of which a threshold is set to turn on/off said read cell in accordance with storage data upon selection, and reference cells in each of which a threshold is set to turn on said reference cell upon selection;

word lines each commonly connected to control gates of read cells on the same row in each of said first and second memory cell arrays;

word lines each commonly connected to control gates of reference cells on the same row in each of said first and second memory cell arrays;

a flip-flop type sense amplifier for comparing changes in bit line voltages of said read and reference cells and reading out whether said read cell is an ON or OFF cell by a method of precharging and then discharging said first and second memory cell arrays;

a circuit for starting precharge in synchronism with input of an address signal for designating which of said word lines connected to said read cells is set to a selected state; and means for setting a word line connected to said reference cell to a selected state in synchronism with an end of precharge.

6. A memory according to claim 5, wherein said means for setting a word line connected to said reference cell to a selected state sets said word line to a selected state in accordance with a signal for forming a precharge/discharge timing, and a signal for setting said word lines to an unselected state in a write.

7. A nonvolatile semiconductor memory comprising:

a first memory cell array constituted by laying out in an array data storage read cells in each of which a threshold is set to turn on/off said read cell in accordance with storage data upon selection, and reference cells in each of which a threshold is set to turn on said reference cell upon selection;

a second memory cell array constituted by laying out in an array data storage read cells in each of which a threshold is set to turn on/off said read cell in accordance with storage data upon selection, and reference cells in each of which a threshold is set to turn on said reference cell upon selection;

word lines each commonly connected to control gates of read cells on the same row in each of said first and second memory cell arrays;

word lines each commonly connected to control gates of reference cells on the same row in each of said first and second memory cell arrays;

a flip-flop type sense amplifier for comparing changes in bit line voltages of said read and reference cells and reading out whether said read cell is an ON or OFF cell by a method of precharging and then discharging said first and second memory cell arrays; and a setting circuit for setting a word line connected to said reference cell to either of selected and unselected states in synchronism with a precharge signal for forming a precharge/discharge timing.

8. A memory according to claim 7, wherein said setting circuit comprises a first NOR gate circuit for receiving a signal for controlling whether either of said first and second memory cell arrays is defined as a read cell side and the signal for forming a precharge/discharge timing, and a second NOR gate circuit for receiving an output signal from said first NOR gate and a signal for setting said word line to an unselected state in a write.

* * * * *